(12) United States Patent
Raettich et al.

(10) Patent No.: US 10,609,847 B2
(45) Date of Patent: Mar. 31, 2020

(54) METHOD FOR PRODUCING A HOUSING COMPONENT WITH SHIELDING FROM ELECTROMAGNETIC RADIATION AND WITH ENVIRONMENTAL SEAL FUNCTION, AND HOUSING COMPONENT

(71) Applicant: Bayerische Motoren Werke Aktiengesellschaft, Munich (DE)

(72) Inventors: Philip Raettich, Munich (DE); Matthias Wagner, Munich (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 0 days.

(21) Appl. No.: 15/957,451

(22) Filed: Apr. 19, 2018

(65) Prior Publication Data
US 2018/0249601 A1  Aug. 30, 2018

Related U.S. Application Data

(63) Continuation of application No. PCT/EP2016/073712, filed on Oct. 5, 2016.

(30) Foreign Application Priority Data

Oct. 21, 2015 (DE) .................. 10 2015 220 473

(51) Int. Cl.
  *H05K 9/00* (2006.01)
  *B29D 99/00* (2010.01)
  (Continued)

(52) U.S. Cl.
  CPC ......... *H05K 9/0049* (2013.01); *B29D 99/006* (2013.01); *H05K 5/0004* (2013.01);
  (Continued)

(58) Field of Classification Search
  CPC .................... H05K 9/0024; H05K 9/0026
  See application file for complete search history.

(56) References Cited

U.S. PATENT DOCUMENTS

| | | | |
|---|---|---|---|
| 6,202,276 B1 * | 3/2001 | Chuang | B21D 26/055 29/421.1 |
| 7,506,436 B2 | 3/2009 | Bachman | |

(Continued)

FOREIGN PATENT DOCUMENTS

| | | |
|---|---|---|
| CN | 1488236 A | 4/2004 |
| CN | 101588709 A | 11/2009 |

(Continued)

OTHER PUBLICATIONS

PCT/EP2016/073712, International Search Report dated Jan. 3, 2017 (Two (2) pages).

(Continued)

*Primary Examiner* — Hung V Ngo
(74) *Attorney, Agent, or Firm* — Crowell & Moring LLP

(57) ABSTRACT

A method for producing a housing component with shielding from electrical and/or magnetic radiation and with an environmental seal function, is disclosed. A metal housing part is produced by folding a metal sheet. A synthetic shaped part is produced by thermoforming such that the shape of the synthetic shaped part matches the metal housing part. The synthetic shaped part is connected to the metal housing part. A method for producing a high-voltage store, a housing component with shielding from electrical and/or magnetic radiation, and a high-voltage store are also disclosed.

12 Claims, 1 Drawing Sheet

(51) Int. Cl.
*H05K 5/00* (2006.01)
*H05K 5/04* (2006.01)
*B29L 31/34* (2006.01)
*B29C 65/02* (2006.01)
*B29C 65/48* (2006.01)
*B29C 65/00* (2006.01)
*B29C 51/00* (2006.01)
*B29K 23/00* (2006.01)

(52) U.S. Cl.
CPC ............... *H05K 5/04* (2013.01); *B29C 51/00* (2013.01); *B29C 65/02* (2013.01); *B29C 65/48* (2013.01); *B29C 66/545* (2013.01); *B29C 66/742* (2013.01); *B29K 2023/06* (2013.01); *B29K 2023/12* (2013.01); *B29K 2995/0011* (2013.01); *B29L 2031/3481* (2013.01)

(56) References Cited

U.S. PATENT DOCUMENTS

| | | | | |
|---|---|---|---|---|
| 2004/0120131 | A1* | 6/2004 | Arnold | H05K 9/003 361/818 |
| 2004/0262021 | A1* | 12/2004 | Leu | H05K 9/0083 174/391 |
| 2006/0279468 | A1* | 12/2006 | Yoneya | H01Q 1/3233 343/713 |
| 2010/0265656 | A1 | 10/2010 | Yamaguchi et al. | |
| 2013/0083498 | A1* | 4/2013 | Wu | H05K 9/0032 361/752 |
| 2013/0242487 | A1* | 9/2013 | Fujioka | B29C 45/14221 361/679.01 |
| 2016/0044840 | A1* | 2/2016 | Wagner | H01M 2/1094 174/384 |

FOREIGN PATENT DOCUMENTS

| | | |
|---|---|---|
| CN | 101868132 A | 10/2010 |
| DE | 10 2008 046 534 A1 | 4/2009 |
| DE | 10 2012 109 447 A1 | 4/2014 |
| DE | 10 2013 112 413 A1 | 5/2014 |
| DE | 10 2013 213 233 A1 | 1/2015 |
| WO | WO 2004/027340 A2 | 4/2004 |

OTHER PUBLICATIONS

German Search Report issued in German counterpart application No. 10 2015 220 473.1 dated Jun. 6, 2016, with Statement of Relevancy (Six (6) pages).

Chinese Office Action issued in Chinese counterpart application No. 201680040143.2 dated Feb. 1, 2019 (Eight (8) pages).

* cited by examiner

METHOD FOR PRODUCING A HOUSING COMPONENT WITH SHIELDING FROM ELECTROMAGNETIC RADIATION AND WITH ENVIRONMENTAL SEAL FUNCTION, AND HOUSING COMPONENT

CROSS REFERENCE TO RELATED APPLICATIONS

This application is a continuation of PCT International Application No. PCT/EP2016/073712, filed Oct. 5, 2016, which claims priority under 35 U.S.C. § 119 from German Patent Application No. 10 2015 220 473.1, filed Oct. 21, 2015, the entire disclosures of which are herein expressly incorporated by reference.

BACKGROUND AND SUMMARY OF THE INVENTION

What is disclosed is a method for producing a housing with a shielding from electrical and/or magnetic radiation and with an environmental seal function, a method for producing a high-voltage store, as well as a housing component and a high-voltage store with shielding from electrical and/or magnetic radiation and an environmental seal function.

An electrical apparatus may include an electrical device and a housing which surrounds and protects the electrical device. In order to ensure a trouble-free operation of the electrical device, it is necessary in a lot of electrical apparatuses for the housing on the one hand to shield the electrical device from electromagnetic radiation and on the other hand to fulfill an environmental seal function, for example to prevent the penetration of moisture and/or dust. Such electrical apparatuses include, for example, high-voltage stores, which are provided in vehicles with electric drive in order to supply the electrical energy.

Production methods and materials for housings of high-voltage stores for motor vehicles which are known thus far are, for example, aluminum casting, aluminum deep drawing, plastic injection molding, SMC (Sheet molding compound) components, LFT (long Liber-reinforced thermoplastics), etc.

The drawback with the housings known in the prior art or the methods for their production is that the currently known fabrication methods, especially for small piece lots, involve very high onetime expenses for tooling and series production equipment. Furthermore, a high material input is required on account of the fabrication methods, resulting in high production costs. Furthermore, the housings known in the prior art have a heavy weight.

Starting from the prior art, one problem of at least some embodiments is therefore to indicate a method for producing a housing component with a shielding from electrical and/or magnetic radiation and with an environmental seal function, by means of which such housing components can be produced cost-effectively and with a low material outlay. Further problems are to indicate a method for producing a high-voltage store as well as a housing component and a high-voltage store with shielding from electrical and/or magnetic radiation and with an environmental seal function.

In the method described here for producing a housing component, a metal housing part is produced by folding a metal sheet. Preferably, the metal housing part after the folding has a plurality of folds. After the folding, the metal housing component may have, for example, a cuboidal shape or a cube shape as its basic shape, while preferably one side surface is not formed, so that the metal housing component may remain open on one side. Preferably the metal housing part produced by folding the metal sheet is formed as a single piece. In particular, the metal housing part may consist of the folded metal sheet. For example, the metal sheet may be a metal plate cut out from a sheet metal coil, such as by means of laser cutting, water jet cutting, or punching. In addition or alternatively to the folding of the metal sheet, the metal sheet may also be beveled, flanged and/or clinched to form the metal housing component. The metal sheet may be, for example, aluminum, an aluminum alloy, steel or a steel alloy, or consist of one of these materials.

Furthermore, a plastic molded part is produced by thermoforming. Preferably, the plastic molded part after the forming process has a shape adapted to the metal housing part. For example, the plastic molded part after the forming process may be shaped such that it is suitably formed for an interior lining of the metal housing part or is suitably formed for an exterior covering of the metal housing part. The plastic molded part may, for example, have a basic outer form corresponding to the metal housing part.

For the production of the plastic molded part, a plastic granulate may be shaped into sheetware or rollware, for example. The resulting plastic plates or plastic films can then be shaped by means of thermoforming. The plastic molded part may, for example, be a thermoplastic material or consist of a thermoplastic material. For example, the plastic molded part may be polypropylene or polyethylene or consist of polypropylene or polyethylene. The plastic molded part is connected to the metal housing part, wherein the plastic molded part after the connecting is preferably in direct contact with the metal housing part and/or after the connecting has a substantially identical spacing from the metal housing part throughout.

With the method described here, it is possible to produce a housing component with an environmental seal function and an EMC shielding effect.

As compared to traditional housings, a significant cost advantage is achieved by reduction of the tooling complexity.

According to another embodiment, the metal housing part after its production has an outer wall and an inner wall. Preferably, the plastic molded part is connected to the metal housing part such that the plastic molded part is arranged on the inner wall of the metal housing part. For example, the plastic molded part may be joined over a large area to the inner wall of the metal housing part.

According to another embodiment, the plastic molded part is connected to the metal housing part such that the plastic molded part entirely covers the inner wall of the metal housing part. For example, the plastic molded part after the connecting may contact the entire surface of the inner wall of the metal housing part.

According to another embodiment, the plastic molded part is connected to the metal housing part such that the plastic molded part is arranged on the outer wall of the metal housing part. For example, the plastic molded part after the connecting may be joined over a large area to the outer wall of the metal housing part.

According to another embodiment, the plastic molded part is connected to the metal housing part such that the plastic molded part entirely covers the outer wall of the metal housing part. For example, the plastic molded part after the connecting may contact the entire surface of the outer wall of the metal housing part.

According to another embodiment, the plastic molded part is formed as a plastic film. Preferably, the plastic film has a thickness which is less than or equal to 1.5 mm. By the term "thickness" is meant here the extension of the plastic film perpendicular to its principal direction of spreading. Furthermore, the plastic film may have a thickness less than or equal to 1.0 mm, or alternatively less than or equal to 0.5 mm.

According to another embodiment, the plastic molded part is formed as a plastic film, and the plastic film after the production of the metal housing part is drawn into the metal housing part. For example, the drawing of the plastic film into the metal housing part may be done by vacuum deep drawing.

According to another embodiment, the metal housing part after the folding of the metal sheet has metal lugs protruding outward from the opening of the metal housing part. By means of the protruding metal lugs, the metal housing part can be connected to another metal housing part.

According to another embodiment, the plastic molded part be a thermoplastic material or consists of a thermoplastic material. For example, the plastic molded part may be polypropylene or polyethylene or consist of one of the mentioned materials. In particular, the plastic molded part serves to provide the housing component with an adequate environmental seal function.

According to another embodiment, the metal sheet has a thickness which is greater than or equal to 0.5 mm. Especially preferably, the metal sheet has a thickness greater than or equal to 1.0 mm. Alternatively, the metal sheet may have a thickness greater than or equal to 1.5 mm. By the term "thickness" is meant here the extension of the metal sheet perpendicular to its principal direction of spreading. The metal housing part produced from the metal sheet by folding serves in particular for providing an adequate EMC shielding to the housing component.

According to another embodiment, the metal sheet has a thickness greater than 1.0 mm throughout and the plastic molded part has a thickness less than or equal to 1.0 mm throughout. In such a design, the metal sheet is thick enough to absorb the entire mechanical strain on the housing component. Thus, the plastic molded part can be designed to be as thin as necessary. According to another preferred embodiment, the plastic molded part has a thickness greater than 1.0 mm throughout and the metal sheet has a thickness less than or equal to 1.0 mm throughout. In this way, the plastic molded part is thick enough to absorb at least some of the mechanical strain on the housing component. Thus, the metal sheet can be designed very thin.

According to another embodiment, the connecting of the plastic molded part to the metal housing part is done by means of bonding. For example, the plastic molded part, which may be formed as a plastic film for example, can be connected to the metal housing part by means of an adhesive. Furthermore, the connecting of the plastic molded part to the metal housing part may be done by heat sealing. Preferably, the connecting of the plastic molded part to the metal housing part is done after a forming process in which the plastic molded part is placed in the form adapted to the metal housing part. The forming process may also be in particular a method step in which the plastic molded part is shaped by thermoforming.

According to another embodiment, the folded metal sheet has overlapping regions which are joined to each other. For example, individual metal lugs of the metal sheet may overlap each other entirely after the folding of the metal sheet. The overlapping regions may be joined together, for example, by flanging, by welding, or by clinching. For example, the metal housing part formed as a single piece by folding of the metal sheet may have four regions, in which metal lugs of the metal sheet overlap entirely. By joining together the overlapping regions, a good electromagnetic shielding effect can be achieved.

According to another embodiment, the metal housing part has a plurality of cavities. The cavities may have the shape of holes or slots, for example. The cavities may be arranged equidistant for example. The cavities may be produced, for example, by a stamping process. Preferably, the individual cavities have a size enabling an adequate EMC shielding of the housing component by the metal housing part. With the aid of the cavities, the metal housing part may advantageously have a low weight.

Furthermore, a method is indicated for producing a high-voltage store with shielding from electrical and/or magnetic radiation and an environmental seal function. In this, a housing component is produced, which may have one or more of the features of the aforementioned embodiments. Furthermore, another housing component is provided with at least one charge storage device, wherein the additional housing component surrounds the charge store. Furthermore, the housing component is connected to the additional housing component. The housing component may, for example, form a kind of cover for the high-voltage store. After the connecting of the housing component to the additional housing component, the high-voltage store produced may have a closed housing, which can be formed by the housing component and the additional housing component. The housing component and the additional housing component may be joined together, for example, by means of one or more connection elements, such as screws.

According to another embodiment, the plastic molded part is connected to the metal housing part during the connecting of the housing component to the additional housing component. For example, the plastic molded part and the metal housing part may be present in the non-connected form until the housing component is connected to the additional housing component. Thus, the plastic molded part and the metal housing part need not be joined beforehand. For example, the connecting of the plastic molded part to the metal housing part may be done by screwing together the housing component with the additional housing component.

Furthermore, a housing component with shielding from electrical and/or magnetic radiation and an environmental seal function is indicated. The housing component has a metal housing part produced by folding a metal sheet. Preferably, the metal housing part is formed as a single piece. In particular, the metal housing part may consist of the folded metal sheet. Furthermore, the housing component has a plastic molded part produced by thermoforming, which has a shape adapted to the metal housing part, and which is directly connected to the metal housing part.

The housing component may furthermore have one or more of the features of the embodiments mentioned in connection with the method for producing the housing component. In particular, the housing component may be produced with the previously described method. For example, the metal housing part may have an outer wall and an inner wall, wherein the plastic molded part is connected to the metal housing part such that the plastic molded part is arranged on the inner wall or on the outer wall of the metal housing part. Furthermore, the plastic molded part may be formed, for example, as a plastic film, which may be, for example, a thermoplastic material, such as polypropylene or polyethylene. The plastic film may have a thickness less than or equal to 1.0 mm, for example. The metal housing part may have a thickness greater than or equal to 1.0 mm, for example. Preferably, the metal housing part has overlapping regions which are joined together by a joining process, such as flanging, welding, or clinching. Furthermore, the metal housing part may have a plurality of cavities, which may be formed as holes or slots, for example.

Furthermore, a high-voltage store with shielding from electrical and/or magnetic radiation and with an environmental seal function is indicated, having a housing component as described here. The high-voltage store furthermore has an additional housing component connected to the housing component as well as at least one charge store, which is arranged in a cavity defined by the housing component and the additional housing component.

As compared to traditional housings, the method described here for producing a housing component and for producing a high-voltage store with such a housing component has an enormous cost advantage, especially since it accomplishes a reduction in the tooling complexity. Furthermore, a housing component as described here has an extremely low weight as compared to traditional housings. This is achieved in particular by an increased flexibility in the choice of the material thicknesses of the metal housing part and the plastic molded part. The method described is suited to many utilized materials which may be chosen in regard to the important criteria for the housing component of strength, EMC, shielding, and environmental seal.

Other objects, advantages and novel features of the present invention will become apparent from the following detailed description of one or more preferred embodiments when considered in conjunction with the accompanying drawings.

Further advantages and advantageous embodiments of the method described here as well as the housing component described here with shielding from electrical and/or magnetic radiation and environmental seal function will emerge from the following in connection with the embodiments described in the drawings.

DETAILED DESCRIPTION OF THE DRAWINGS

Figure 1A:
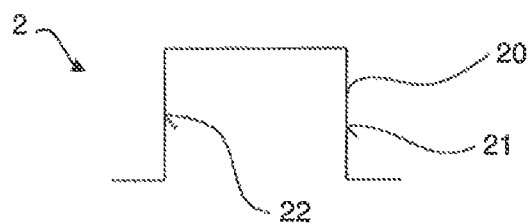
FIGS. 1A to 1D schematically represent a method for producing a housing component with shielding from electrical and/or magnetic radiation according to one exemplary embodiment of the present invention.
Figure 1B:
Figure 1C:
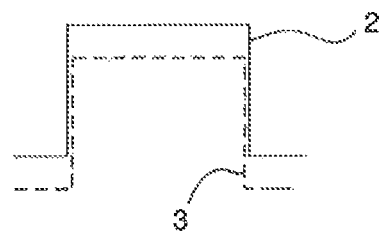

In the exemplary embodiments and figures, the same or equivalent components are provided with the same reference numbers each time. The elements depicted and their size relations should basically be assumed to be not true to scale. Instead, individual elements may be shown with exaggerated thickness or size for a better representation and/or a better comprehension.

FIGS. 1A to 1D show a schematic representation of a method for producing a housing component 1 with shielding from electrical and/or magnetic radiation and with an environmental seal function according to one exemplary embodiment. In step 1A of the method, a metal housing part 2 is produced by folding a metal sheet 20. The metal sheet 20 may be a plate cut out from coil stock, for example by laser cutting, water jet cutting, or a punching process. The metal sheet 20 may be, for example, a steel sheet or an aluminum sheet. After the folding, the metal housing part 2 preferably has a plurality of regions bent with respect to each other. Especially preferably, the metal housing part 2 after the folding has a basic shape of a housing, which has five closed side surfaces. For example, the metal housing part 2 may have the shape of a cuboid or a cube having an opening. After the folding of the metal sheet 20, the metal housing part 2 has an inner wall 22 and an outer wall 21.

In step 1B of the method, a plastic molded part 3 is produced by thermoforming such that after the shaping it has a shape adapted to the metal housing part 2. In the exemplary embodiment shown, the plastic molded part 3 is formed as a plastic film 30, having a thickness less than or equal to 1.0 mm. Preferably, the plastic film 30 is a thermoplastic material such as polypropylene or polyethylene.

Figure 1D:
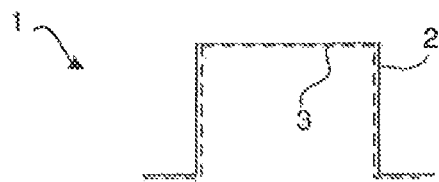
Figure 2A:
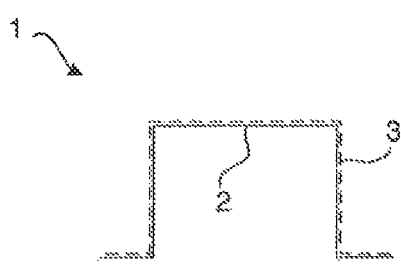
FIGS. 2A and 2B are schematic representations of housing components described here according to further exemplary embodiments.

The plastic molded part 3 is then joined to the metal housing part 2 in step 1C of the method. For example, the joining of the plastic molded part 3 to the metal housing part 2 may be done by bonding or heat sealing. In the exemplary embodiment shown, the plastic molded part 3 after the joining process is arranged on the inner wall 22 of the metal housing part 2, as represented in FIG. 1D. Alternatively, the plastic molded part 3 may be joined to the housing part 2 such that the plastic molded part 3 after the joining process is arranged on the outer wall 21 of the metal housing part 2, as represented in FIG. 2A. The housing component 1 may be, for example, a housing component of a high-voltage store, such as a cover component of a two-piece high-voltage store.

Figure 2B:
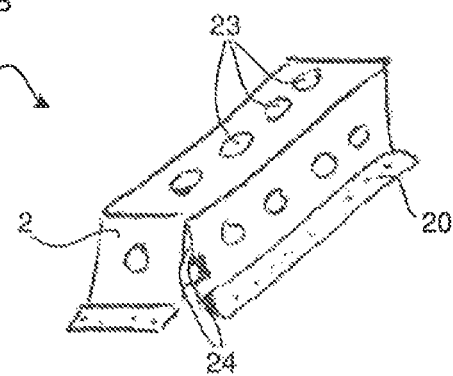

FIG. 2B shows a schematic representation of a housing component 1 described here according to a further exemplary embodiment. The housing component 1 has a cuboidal basic shape and has a plurality of overlapping regions 24, which are joined together by means of a joining process, such as flanging, welding, or clinching. For example, the overlapping regions 24 may be formed as metal lugs, which are joined together by a plurality of welding points. The housing component 1 is open at one side of the housing, the metal housing part 2 having outwardly folded metal lugs at the opening, by means of which the housing component 1 can be connected to another housing component, for example by means of screws. Together with the further housing component, the housing component 1 may form a closed housing of a high-voltage store, in which one or more charge stores may be arranged. In the exemplary embodiment shown, a plurality of cavities 23 are formed in the metal housing part 2, which can be made for example by a stamping process. Thanks to the cavities 23, the housing component 1 can have a low weight.

The features described in the exemplary embodiments depicted may also be combined with each other according to further exemplary embodiments. Alternatively or additionally, the exemplary embodiments shown in the figures may have further features according to the embodiments of the general description.

LIST OF REFERENCE CHARACTERS 1 housing component
2 metal housing part
20 metal sheet
21 outer wall
22 inner wall
23 cavity
24 overlapping region 3 plastic molded part
30 plastic film The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for producing a housing component with a shielding from electrical and/or magnetic radiation and with an environmental seal function, comprising the acts of:
   in a first act, producing a metal housing part by folding a metal sheet;
   in a second act which follows the first act, producing a plastic molded part by thermoforming such that the plastic molded part has a shape adapted to the produced metal housing part; and
   in a third act which follows the second act, connecting the produced plastic molded part to the produced metal housing part.

2. The method as claimed in claim 1, wherein the metal housing part has an outer wall and an inner wall and wherein the plastic molded part is connected to the metal housing part such that the plastic molded part is disposed on the inner wall of the metal housing part.

3. The method as claimed in claim 2, wherein the plastic molded part is a plastic film.

4. The method as claimed in claim 3, wherein the plastic film has a thickness less than or equal to 1.0 mm.

5. The method as claimed in claim 1, wherein the plastic molded part is a plastic film.

6. The method as claimed in claim 5, wherein the plastic film has a thickness less than or equal to 1.0 mm.

7. The method as claimed in claim 1, wherein the plastic molded part is a thermoplastic material.

8. The method as claimed in claim 7, wherein the thermoplastic material is polypropylene or polyethylene.

9. The method as claimed in claim 1, wherein the metal sheet has a thickness greater than or equal to 1.0 mm.

10. The method as claimed in claim 1, wherein the act of connecting is done by bonding or heat sealing.

11. The method as claimed in claim 1, wherein the metal housing part has overlapping regions which are joined to each other.

12. The method as claimed in claim 1, wherein the metal housing part has a plurality of cavities.

* * * * *